(12) United States Patent
Ji et al.

(10) Patent No.: US 11,703,211 B2
(45) Date of Patent: Jul. 18, 2023

(54) LED PANEL LAMP AND MANUFACTURING METHOD OF THE LED PANEL LAMP

(71) Applicants: IVTOUCH CO., LTD., Suzhou (CN); SVG TECH GROUP CO., LTD., Suzhou (CN); SOOCHOW UNIVERSITY, Suzhou (CN)

(72) Inventors: Liangliang Ji, Suzhou (CN); Linyue Liu, Suzhou (CN); Xiaohong Zhou, Suzhou (CN)

(73) Assignees: IVTOUCH CO., LTD., Suzhou (CN); SVG TECH GROUP CO., LTD., Suzhou (CN); SOOCHOW UNIVERSITY, Suzhou (CN)

( * ) Notice: Subject to any disclaimer, the term of this patent is extended or adjusted under 35 U.S.C. 154(b) by 0 days.

(21) Appl. No.: 17/640,957

(22) PCT Filed: Nov. 12, 2019

(86) PCT No.: PCT/CN2019/117481
§ 371 (c)(1),
(2) Date: Mar. 7, 2022

(87) PCT Pub. No.: WO2020/244147
PCT Pub. Date: Dec. 10, 2020

(65) Prior Publication Data
US 2022/0397263 A1 Dec. 15, 2022

(30) Foreign Application Priority Data

Jun. 3, 2019 (CN) .................. CN201910478721.6

(51) Int. Cl.
*F21V 19/00* (2006.01)
*F21K 9/66* (2016.01)
*F21V 3/06* (2018.01)
*F21Y 115/10* (2016.01)

(52) U.S. Cl.
CPC ............ *F21V 19/0025* (2013.01); *F21K 9/66* (2016.08); *F21V 3/062* (2018.02); *F21V 19/0045* (2013.01); *F21Y 2115/10* (2016.08)

(58) Field of Classification Search
CPC .................... F21V 19/0025; F21V 19/0045
See application file for complete search history.

(56) References Cited

FOREIGN PATENT DOCUMENTS

| CN | 204791825 U | 11/2015 |
|---|---|---|
| CN | 108022530 A | 5/2018 |
| CN | 108766269 A | 11/2018 |

(Continued)

*Primary Examiner* — Karabi Guharay
(74) *Attorney, Agent, or Firm* — SZDC Law P.C.

(57) ABSTRACT

An LED panel light includes a flexible base film, a plurality of circuits arranged on the flexible base film and a plurality of LED lamp beads arranged on the flexible base film, each circuit is connected with at least one LED lamp bead and is provided with at least two mutually parallel conductive wires. The conductive wire consists of a plurality of secondary conductive wires, and a plurality of the secondary conductive wires form a mesh. A method of making a LED panel light includes the following specific steps: S1: providing a flexible base film; S2: manufacturing a plurality of mesh-type conductive wires on the flexible base film by using a mould with circuit patterns of LED panel light; conductive wires forming a circuit, and a plurality of the circuits forming an LED panel light circuit; S3: connecting LED lamp beads with the conductive wires in the circuits.

8 Claims, 6 Drawing Sheets

(56) References Cited

FOREIGN PATENT DOCUMENTS

| | | | |
|---|---|---|---|
| CN | 109103176 | A | 12/2018 |
| CN | 209893141 | U | 1/2020 |
| KR | 20180047399 | A | 5/2018 |

LED PANEL LAMP AND MANUFACTURING METHOD OF THE LED PANEL LAMP

CROSS REFERENCE TO RELATED APPLICATIONS

This application is the National Stage Application of PCT/CN2019/117481, filed on Nov. 12, 2019, which claims priority of Chinese Patent Application No. 201910478721.6, filed Jun. 3, 2019, the entire contents of which are incorporated herein by reference.

FIELD OF THE INVENTION

The disclosure relates to the field of LED, and particularly relates to an LED panel light and a method of making an LED panel light.

DESCRIPTION OF THE PRIOR ART

The existing LED panel light mostly uses ITO conductive film (Indium Tin Oxides, N-type oxide semiconductor—indium tin oxide, and an ITO film, i.e., an indium tin oxide semiconductor transparent conductive film) to perform wiring. The conductive wires arranged by the existing LED panel light are thick and have the low electric response speed. It is well known that the electric response speed affects the dynamic picture effect of the LED panel light.

The preceding description merely provides general background information and does not necessarily constitute prior art.

SUMMARY OF THE INVENTION

The present invention aims to provide an LED panel light with fast electric response speed and a method of making an LED panel light.

The present invention provides an LED panel light, including a flexible base film, a plurality of circuits arranged on the flexible base film and a plurality of LED lamp beads arranged on the flexible base film, each circuit is connected with at least one LED lamp bead and is provided with at least two mutually parallel conductive wires, wherein the conductive wire consists of a plurality of secondary conductive wires, and a plurality of the secondary conductive wires form a mesh.

In one of the embodiments, the flexible base film is provided with a groove, and the conductive wires are disposed within the groove.

In one of the embodiments, the line width of the secondary conductive wires is 1 to 10 μm, the distance between the two adjacent and parallel secondary conductive wires is 20 to 50 μm.

In one of the embodiments, the circuits are parallel circuit, including a main conductive wire group and a branch conductive wire group; one end of the branch conductive wire group is connected with the main conductive wire group and the other end is connected with the LED lamp bead; wherein the main conductive wire group is formed by n conductive wires, the branch conductive wire group is formed by $2 \times C^2_n$ conductive wires, n is an integer greater than 3.

In one of the embodiments, a plurality of the LED lamp beads are arranged in array, one main conductive wire group is arranged between two columns of the LED lamp beads, and each main conductive wire group is connected with at least one column of the LED lamp beads.

In one of the embodiments, the LED panel light further includes a plurality of controllers, each of which is connected with at least one main conductive wire group.

In one of the embodiments, the LED panel light is provided with a protective cover wrapping the LED lamp beads, and the protective cover is made of transparent curable adhesive.

The present invention further provides a method of making an LED panel light, including the following specific steps:

S1: providing a flexible base film;
S2: manufacturing a plurality of mesh-type conductive wires on the flexible base film by using a mould with circuit patterns of LED panel light; where a plurality of the conductive wires form a circuit, and a plurality of the circuits form an LED panel light circuit;
S3: connecting LED lamp beads with the conductive wires in the circuits.

In one of the embodiments, in the step S2: embossing a plurality of the conductive wire grooves on the flexible base film by using a mould with circuit patterns of LED panel light and employing UV imprinting process, where each conductive wire groove includes a plurality of secondary conductive wire grooves; scraping and filling conductive silver paste in the secondary conductive wire grooves to form a plurality of the mesh-type conductive wires after curing.

In one of the embodiments, after the step S3, the method further includes making a protective cover, specifically including: dropping transparent curable adhesive to wrap the LED lamp beads, and curing the transparent curable adhesive to form the protective cover under the irradiation of ultraviolet light.

In accordance with the LED panel light provided in the present invention, the conductive wire consists of a plurality of secondary conductive wires, and a plurality of the secondary conductive wires form a mesh, reducing the resistance of the conductive wire, enabling the charge to transfer faster in the conductive wire. Thereby, the electric response speed in the circuit is faster, and in turn the LED panel light is provided with a better visual effect during operation.

DESCRIPTION OF THE SPECIFIC EMBODIMENTS

The specific embodiments of the present invention are described hereinafter in detail in combination with drawings and embodiments. The following embodiments are merely for illustrative purposes but shall not be construed as limiting the present invention.

Referring to FIGS. 1 to 6, the LED panel light provided in the embodiment of the present invention includes a flexible base film 1, a plurality of circuits arranged on the flexible base film 1 and a plurality of LED lamp beads 2 arranged on the flexible base film 1. Each circuit is connected with at least one LED lamp bead 2. The circuit is provided with at least two mutually parallel conductive wires 3, wherein each conductive wire 3 consists of a plurality of secondary conductive wires 31, and a plurality of the secondary conductive wires 31 form a mesh.

In the present embodiment, each conductive wire 3 is designed to be mesh-type and consists of a plurality of secondary conductive wires 31, which is equivalent to refining the entire conductive wire 3 into a plurality of secondary conductive wires 31 while meeting the electric response speed. Adopting the design, the resistance of the conductive wire is lower, the charge transmission in the conductive wire is faster, so that the electric response speed in the circuit can be faster while facilitating face curving of the LED panel light.

In the present embodiment, the LED panel light is manufactured by a Metal-mesh process; through this process, the conductive wires have lower resistance and thinner thickness compared with the conductive wires manufactured by traditional ITO process.

Figure 4:
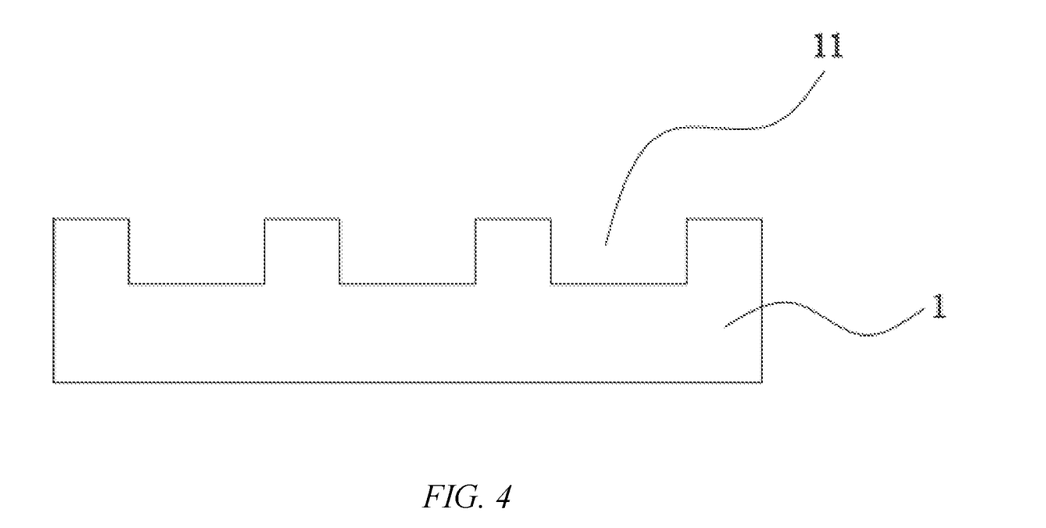
FIG. 4 is a structural schematic diagram illustrating a flexible base film provided in the embodiment of the present invention.
Figure 5:
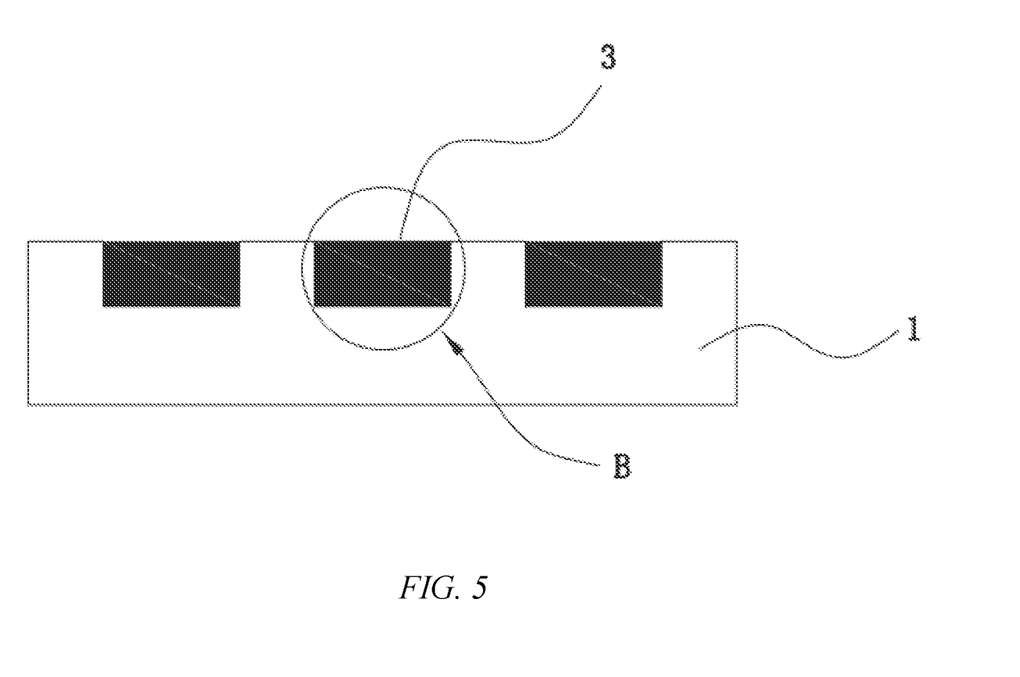
FIG. 5 is a structural schematic diagram illustrating a flexible base film with conductive wires embedded therein provided in the embodiment of the present invention.

The flexible base film 1 is a transparent flexible base film, may be made of PET (Polyethylene terephthalate), PC (Polycarbonate) or PMMA (Polymethyl methacrylate). The flexible base film 1 is provided with grooves 11, and the conductive wires 3 are disposed within the grooves 11.

Figure 2:
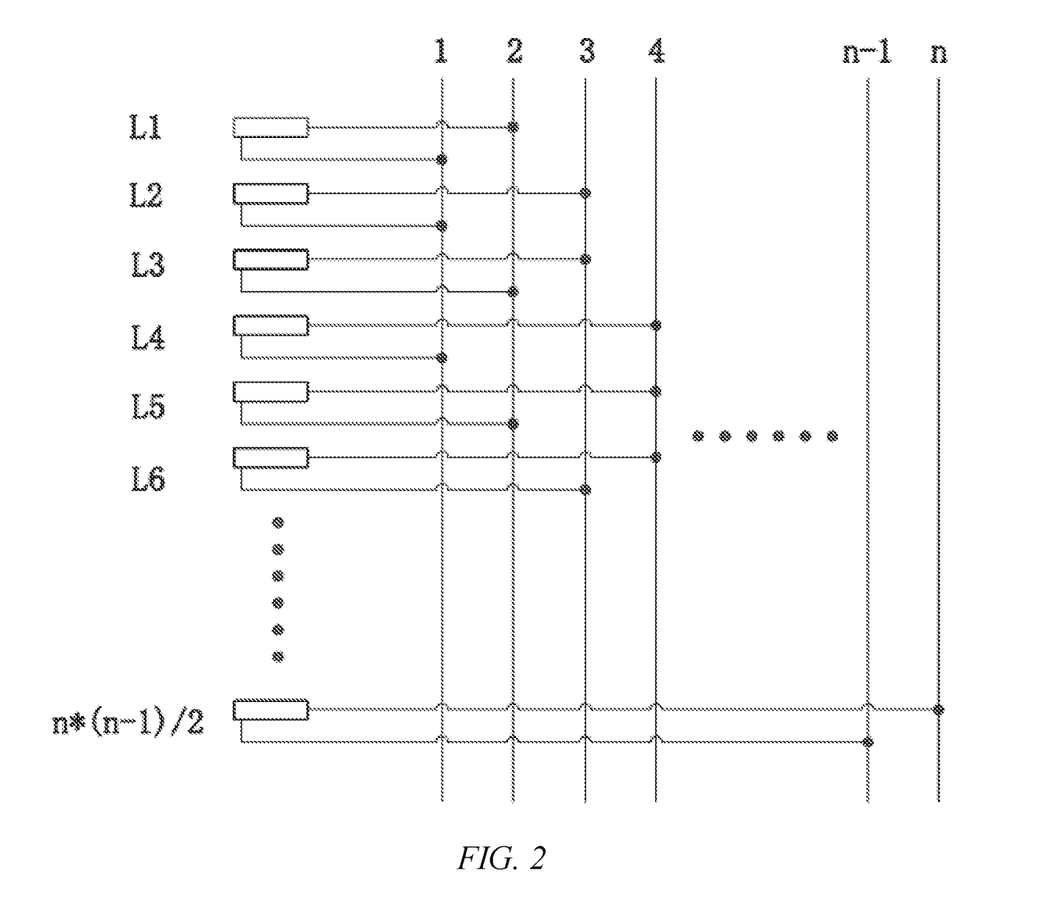
FIG. 2 is a schematic diagram illustrating one parallel circuit of the LED panel light provided in the embodiment of the present invention.

The circuits are parallel circuit including one main conductive wire group and at least two branch conductive wire groups. Wherein the main conductive wire group is formed by n conductive wires 3; each branch conductive wire group consists of two conductive wires, one end of the two conductive wires is respectively connected to the two poles of one LED lamp bead 2, and the other end is respectively connected to two conductive wires of the main conductive wire group; the branch conductive wire group is formed by $2 \times C^2_n$ conductive wires 3, n is an integer greater than 3.

FIG. 2 shows one parallel circuit of the LED panel light, including a total of $C^2_n$ LED lamp beads and $C^2_n$ circuits (the first circuit L1, the second circuit L2, the third circuit L3, the fourth circuit L4, the fifth circuit L5, and the sixth circuit L6 to the $C^2_n$th circuit); and conductive wires (E1, E2, E3, E4 to En) electrically connected to the LED lamp beads.

Specifically, the LED lamp bead in the first circuit L1 is connected with the conductive wires E1 and E2; the LED lamp bead in the second circuit L2 is connected with the conductive wires E1 and E3; the LED lamp bead in the third circuit L3 is connected with the conductive wires E2 and E3; the LED lamp bead in the fourth circuit L4 is connected with the conductive wires E1 and E4; the LED lamp bead in the fifth circuit L5 is connected with the conductive wires E2 and E4; the LED lamp bead in the sixth circuit L6 is connected with the conductive wires E3 and E4; by analogy, the LED lamp bead of the $C^2_n$th circuit is connected with the conductive wires E(n−1) and En.

Figure 3:
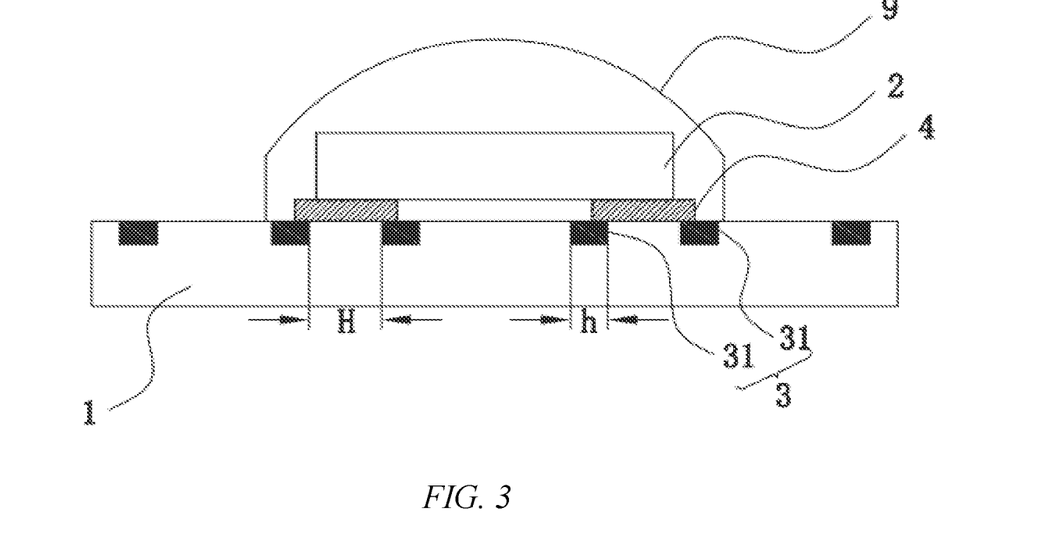
FIG. 3 illustrates the local enlarged side view of A in FIG. 1.
Figure 6:
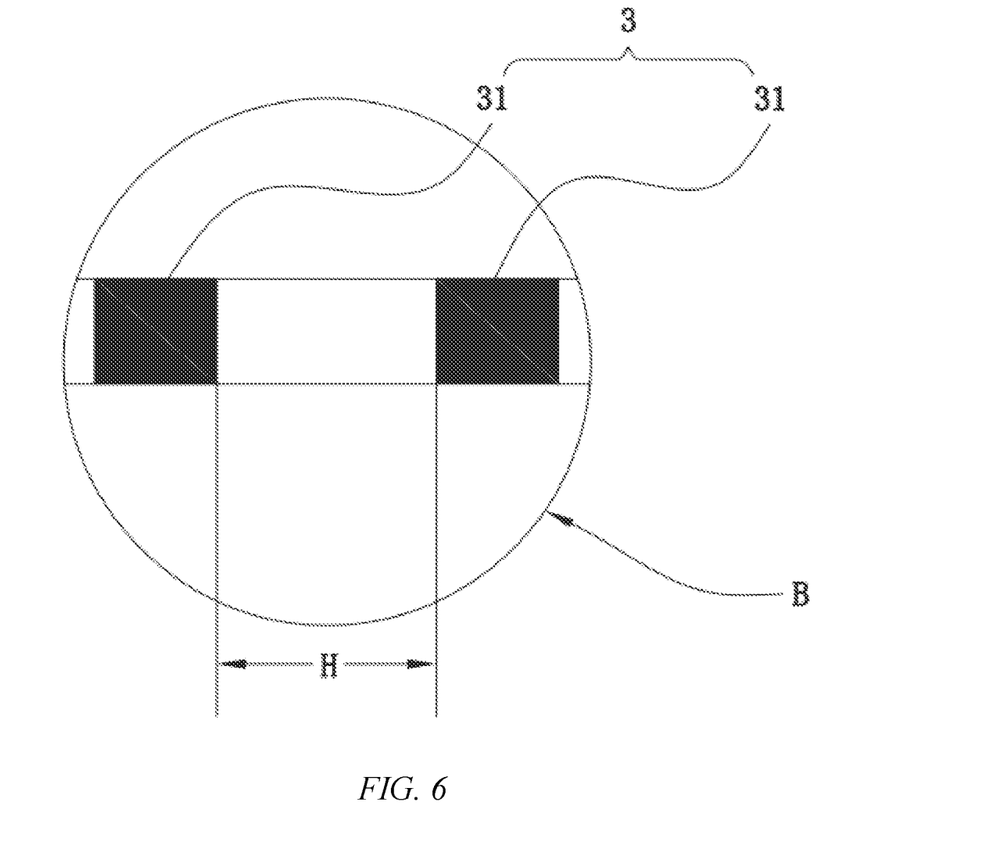
FIG. 6 illustrates the local enlarged side view of B in FIG. 5.

As shown in FIG. 3 and FIG. 6, the line width h of the secondary conductive wire 31 is 1 to 10 μm. The distance H between the two adjacent and parallel secondary conductive wires is 20 to 50 μm. To facilitate the passage of light to the LED panel light, the distance between the adjacent and parallel conductive wires may be adjusted.

Figure 1:
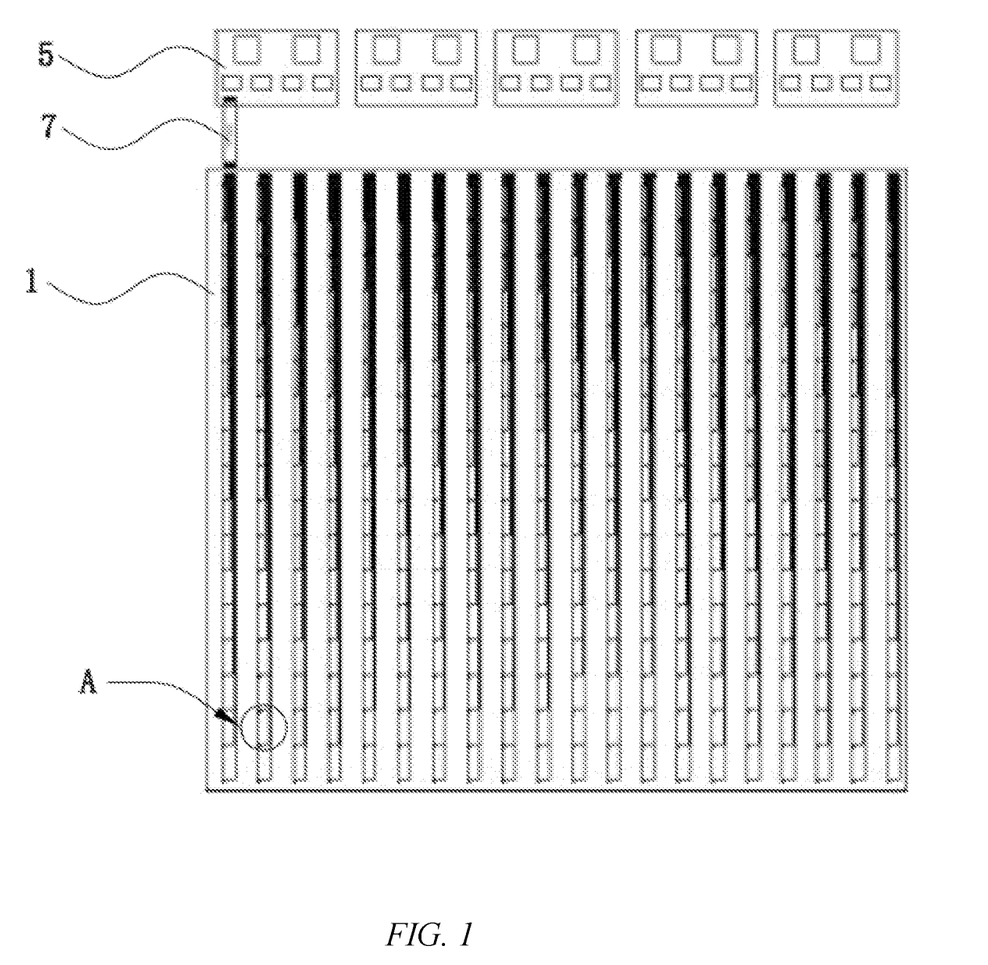
FIG. 1 is a structural schematic diagram illustrating an LED panel light provided in the embodiment of the present invention.

As shown in FIG. 1 and FIG. 3, the LED panel light is provided with conductive silver paste 4 by which the LED lamp beads 2 are bonded to the flexible base film 1. Specifically, arranging the conductive silver paste 4 after melting between two poles of the LED lamp bead 2 and the conductive wires 3 of the branch conductive wire group, then curing the conductive silver paste 4 at low temperature to connect the two conductive wires 3 of the branch conductive wire group with two poles of the LED lamp bead respectively.

A plurality of the LED lamp beads are arranged in array, wherein at least one main conductive wire group is arranged between two columns of the LED lamp beads 2; and each main conductive wire group is connected with at least one column of the LED lamp beads 2. Specifically, the main conductive wire groups are arranged on one side of each column of the LED lamp beads 2, and each main conductive wire group is connected with one column of the LED lamp beads 2.

The LED lamp beads 2 are provided with a protective cover wrapping the LED lamp beads 2, which is made of transparent curable adhesive. Specifically, the transparent curable adhesive is UV adhesive, which has a light transmittance of 90%, is preferred adhesion force to the flexible base film 1.

As shown in FIG. 1, the LED panel light further includes a plurality of controllers 5 and a plurality of flexible circuit boards 7, each controller 5 is indirectly connected with at least one main conductive wire group. Specifically, the flexible circuit board 7 is provided with circuits matched with the controller 5; one end of the flexible circuit board 7 is connected with one controller, and the other end is connected with one main conductive wire group. Each LED lamp bead 2 may be controlled by the controllers 5 to make the LED panel light satisfy the requirements of different graphics, so as to extend the application range of the LED panel light and help popularization.

Figure 7:
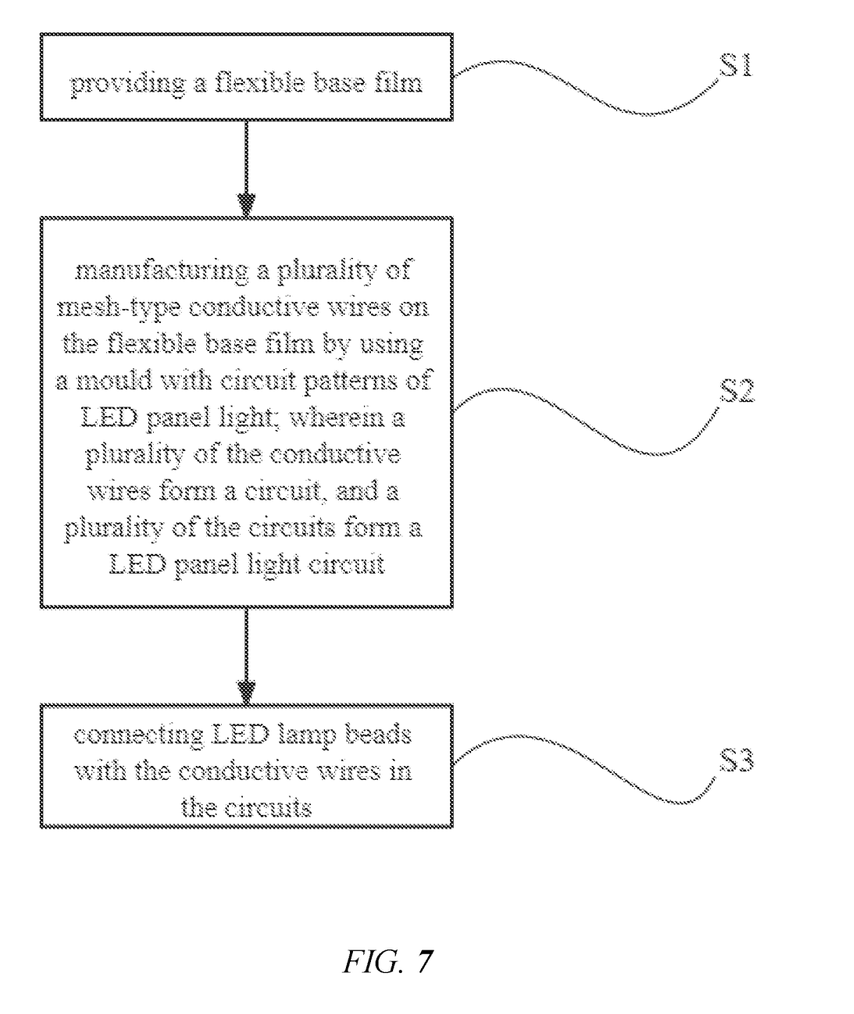
FIG. 7 is a flowchart illustrating a method of making an LED panel light provided in the embodiment of the present invention.

Referring to FIG. 7, the present invention further provides a method of making an LED panel light to manufacture the above LED panel light, including the following specific steps:

S1: providing a flexible base film;

S2: manufacturing a plurality of mesh-type conductive wires on the flexible base film, a plurality of the conductive wires form a circuit, and a plurality of the circuits form an LED panel light circuit;

S3: connecting LED lamp beads with the conductive wires in the circuits.

In the step S2: coating a layer of UV adhesive on the flexible base film, then embossing a plurality of the conductive wire grooves on the flexible base film by using a mould with circuit patterns of LED panel light and employing UV imprinting process. Wherein each conductive wire groove includes a plurality of secondary conductive wire grooves; scraping and filling conductive silver paste in the secondary conductive wire grooves to form a plurality of the mesh-type conductive wires after curing. And a plurality of the mesh-type conductive wires form the circuit, and a plurality of the circuits form the LED panel light circuit.

In other embodiments, an etching process may be carried out directly on the flexible base film to form a plurality of the conductive wire grooves.

In the step S3, conductive silver paste is adopted to connect the LED lamp beads with the conductive wires. Specifically: arranging the conductive silver paste on the two conductive wires of the branch conductive wire group after melting the conductive silver paste, and then respectively adhering the pins of the two poles of the LED lamp beads to the conductive silver paste of the two conductive wires of the branch conductive wire group, finally curing the conductive silver paste at low temperature to connect the two poles of the LED lamp bead with the two conductive wires of the branch conductive wire group respectively.

After the step S3, the method further includes making a protective cover, specifically including: dropping transparent curable adhesive to wrap the LED lamp beads, and curing to obtain the protective cover under the irradiation of ultraviolet light.

The present invention has the following advantages:

1. As each conductive wire consists of a plurality of secondary conductive wires which form a mesh, the resistance of the conductive wire is lower, the charge transmission in the conductive wire is faster, so that the electric response speed in the circuit can be faster, and in turn the LED panel light can be provided with a better visual effect during operation; meanwhile facilitates face curving of the LED panel light.

2. Arranging grooves on the flexible base film and disposing the conductive wires into the grooves, to improve the scratch resistance of the conductive wires and make the LED panel light thinner, so as to improve the camber effect of the LED panel light.

3. Arranging transparent curable adhesive on the LED lamp beads to effectively protect the LED lamp beads from collision damages or being scratched, which can also make the light emitted from the LED lamp beads gentler to be conveniently observed with human eyes; meanwhile, the LED lamp beads can adhere better to the flexible base film to further prevent the LED lamp beads from falling off.

In the drawings, for clarity, the dimensions and relative dimensions of layers and regions are exaggerated. It should be understood that, when a component, such as a layer, is known as "formed on" or "arranged on" another component, this component can be directly arranged on the another component, or an intermediate component can be arranged. On the contrary, when the component is known as "directly formed on" or "directly arranged on" another component, no intervening element is present.

In this context, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the terms in this application according to specific situations.

In this context, it should be understood that, terms such as "up", "down", "front", "rear", "left", "right", "top", "bottom", "inside", "outside", "vertical", and "level" should be construed to refer to the orientation as then described or as shown in the drawings under discussion. These relative terms are for convenience of description and do not require that the present disclosure be constructed or operated in a particular orientation, therefore cannot be construed to limit the present disclosure.

In this context, "a plurality of", "multiple" means two or more, unless otherwise specified.

In this context, the terms "including", "comprising" or any other variant thereof are intended to cover non-exclusive inclusions, in addition to those listed elements, other elements not explicitly listed are also included.

The above-described embodiments are merely examples provided for clarity of description, and are not intended to limit the implementations of the invention. Other variations or changes can be made by those skilled in the art based on the above description. The embodiments are not exhaustive herein. Obvious variations or changes derived therefrom also fall within the protection scope of the invention.

The invention claimed is:

1. A LED panel light, characterized in that, including a flexible base film, a plurality of circuits arranged on the flexible base film and a plurality of LED lamp beads arranged on the flexible base film, each circuit is connected with at least one LED lamp bead and is provided with at least two mutually parallel conductive wires, wherein the conductive wire consists of a plurality of secondary conductive wires, and the plurality of the secondary conductive wires form a mesh, and wherein the flexible base film is provided with a groove, and the conductive wires are completely disposed within the groove.

2. The LED panel light as described in claim 1, characterized in that, the line width of the secondary conductive wires is 1 to 10 μm, the distance between the two adjacent and parallel secondary conductive wires is 20 to 50 μm.

3. The LED panel light as described in claim 1, characterized in that, the circuits are parallel circuit, including a main conductive wire group and a branch conductive wire group; one end of the branch conductive wire group is connected with the main conductive wire group and the other end is connected with the LED lamp bead; wherein the main conductive wire group is formed by n conductive wires, the branch conductive wire group is formed by $2 \times C^2_n$ conductive wires, n is an integer greater than 3.

4. The LED panel light as described in claim 3, characterized in that, a plurality of the LED lamp beads are arranged in array, one main conductive wire group is arranged between two columns of the LED lamp beads, and each main conductive wire group is connected with at least one column of the LED lamp beads.

5. The LED panel light as described in claim 3, characterized in that, the LED panel light further includes a plurality of controllers, each of which is connected with at least one main conductive wire group.

6. The LED panel light as described in claim 1, characterized in that, the LED panel light is provided with a protective cover wrapping the LED lamp beads, and the protective cover is made of transparent curable adhesive.

7. A method of making a LED panel light, characterized in that, including the following specific steps:
   S1: providing a flexible base film;
   S2: manufacturing a plurality of mesh-type conductive wires on the flexible base film by using a mould with circuit patterns of LED panel light; wherein a plurality of the conductive wires form a circuit, and a plurality of the circuits form a LED panel light circuit;
   S3: connecting LED lamp beads with the conductive wires in the circuits,
   wherein in the step S2: embossing a plurality of the conductive wire grooves on the flexible base film by using a mould with circuit patterns of LED panel light and employing UV imprinting process, where each conductive wire groove includes a plurality of secondary conductive wire grooves; scraping and filling conductive silver paste in the secondary conductive wire grooves to form a plurality of the mesh-type conductive wires after curing; and wherein the flexible base film is provided with a groove, and the conductive wires are completely disposed within the groove.

8. The method as described in claim 7, characterized in that, after the step S3, the method further includes making a protective cover, specifically including: dropping transparent curable adhesive to wrap the LED lamp beads, and curing the transparent curable adhesive to form the protective cover under the irradiation of ultraviolet light.

* * * * *